US011296073B2

(12) United States Patent
Hata et al.

(10) Patent No.: US 11,296,073 B2
(45) Date of Patent: Apr. 5, 2022

(54) SEMICONDUCTOR DEVICE

(71) Applicant: Mitsubishi Electric Corporation, Tokyo (JP)

(72) Inventors: Yuki Hata, Tokyo (JP); Akira Yamamoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 6 days.

(21) Appl. No.: 16/765,416

(22) PCT Filed: Feb. 27, 2018

(86) PCT No.: PCT/JP2018/007134
§ 371 (c)(1),
(2) Date: May 19, 2020

(87) PCT Pub. No.: WO2019/167104
PCT Pub. Date: Sep. 6, 2019

(65) Prior Publication Data
US 2020/0335492 A1 Oct. 22, 2020

(51) Int. Cl.
*H01L 27/02* (2006.01)
*H01L 27/088* (2006.01)

(52) U.S. Cl.
CPC ........ *H01L 27/0288* (2013.01); *H01L 27/088* (2013.01)

(58) Field of Classification Search
CPC ............... H01L 27/0288; H01L 27/088; H01L 2224/4917; H01L 2924/13055; H01L 2924/19043
See application file for complete search history.

(56) References Cited

U.S. PATENT DOCUMENTS

| 2005/0189643 A1 | 9/2005 | Zhou et al. |
| 2005/0236617 A1 | 10/2005 | Yamada |
| (Continued) | | |

FOREIGN PATENT DOCUMENTS

| JP | 2001-148458 A | 5/2001 | |
| JP | 2001148458 A | * 5/2001 | ............. H01L 24/48 |
| (Continued) | | | |

OTHER PUBLICATIONS

International Search Report issued in PCT/JP2018/007134; dated May 15, 2018.
(Continued)

*Primary Examiner* — David C Spalla
(74) *Attorney, Agent, or Firm* — Studebaker & Brackett PC

(57) ABSTRACT

An object is to provide a semiconductor device that can prevent increase in the package size and detect a current with high precision by suppressing a current induced by magnetic flux. A semiconductor device 1 is connectable to a control board 100 detecting a current flowing through an IGBT 3 included in the semiconductor device 1 and functioning as a semiconductor element. The semiconductor device 1 includes an insulating substrate, the IGBT 3, and a sense resistor 4. The IGBT 3 is disposed on the insulating substrate 2, and includes a sense electrode and an emitter electrode. The sense resistor 4 is disposed on the insulating substrate 2, and has one end connected to the sense electrode and the other end connected to the emitter electrode. The control board 100 detects a potential difference between both ends of the sense resistor 4 to detect the current flowing through the IGBT 3.

4 Claims, 8 Drawing Sheets

(56) References Cited

U.S. PATENT DOCUMENTS

2006/0065966 A1  3/2006  Zhou et al.
2006/0163716 A1  7/2006  Zhou et al.

FOREIGN PATENT DOCUMENTS

| JP | 2005-311213 A | 11/2005 |
| JP | 2007-525842 A | 9/2007 |
| WO | 2005/091760 A2 | 10/2005 |

OTHER PUBLICATIONS

An Office Action; "Notice of Reasons for Refusal," mailed by the Japanese Patent Office dated Sep. 15, 2020, which corresponds to Japanese Patent Application No. 2020-503111 and is related to U.S. Appl. No. 16/765,416; with English language translation.

* cited by examiner

SEMICONDUCTOR DEVICE

TECHNICAL FIELD

The present invention relates to a semiconductor device that can suppress an induced current generated in a loop formed by connecting a sense terminal to an emitter terminal through a sense resistor when a current flowing through a semiconductor element such as an IGBT is detected.

BACKGROUND ART

In order to detect a current flowing through a semiconductor element such as an IGBT, a sense terminal and an emitter terminal of the semiconductor element are connected to the respective control terminals of a control board in conventional semiconductor devices. A sense resistor is disposed on the control board, and is connected to the control terminal connected to the sense terminal and the control terminal connected to the emitter terminal. The control board detects a potential difference between both ends of the sense resistor to detect the current flowing through the semiconductor element.

Since the sense terminal and the emitter terminal of the semiconductor element need to be connected to the respective control terminals of the control board through bare conductors in power semiconductor devices requiring high reliability, the length of the conductors are increased. Thus, the conventional semiconductor devices have a problem of failing to detect a current with high precision. This is because a magnetic field generated when a sudden large current flows through a main circuit due to, for example, load short circuit creates an induced current in a loop formed by conductors between the sense terminal and the emitter terminal through the sense resistor.

Moreover, the current flowing through the semiconductor element to be detected and the current induced by the magnetic field have the same frequency bandwidth. Thus, there is a problem of failing to remove noise through, for example, a CR filter in a control board. Consequently, various technologies have conventionally been proposed.

For example, Patent Document 1 discloses a semiconductor device including, in a casing, a control circuit having functions equivalent to those of a control board. Housing an insulating substrate and the control circuit in the casing shortens the length of the wires between the sense terminal and the emitter terminal through the sense resistor and reduces a loop formed by the wires. Consequently, since the magnetic flux passing through the loop can be reduced, the current induced by the magnetic flux can also be reduced.

PRIOR ART DOCUMENT

Patent Document

[Patent Document 1] Japanese Patent Application Laid-Open No. 2005-311213

SUMMARY

Problem to be Solved by the Invention

According to the technology described in Patent Document 1, however, housing the insulating substrate and the control circuit in the casing causes a problem of increase in the package size of the semiconductor device.

Thus, the present invention has an object of providing a semiconductor device that can prevent an increase in the package size and can detect a current with high precision by suppressing the current induced by the magnetic flux.

Means to Solve the Problem

A semiconductor device according to the present invention is a semiconductor device connectable to a control board that detects a current flowing through a semiconductor element included in the semiconductor device, the semiconductor device including: an insulating substrate; the semiconductor element disposed on the insulating substrate and including a sense electrode and an emitter electrode; and a sense resistor disposed on the insulating substrate and having one end connected to the sense electrode and the other end connected to the emitter electrode, wherein the control board detects a potential difference between both of the ends of the sense resistor to detect the current flowing through the semiconductor element.

Effects of the Invention

Since the sense resistor is disposed on the insulating substrate on which the semiconductor element is disposed according to the present invention, the sense resistor can be disposed proximate to the semiconductor element. This shortens a distance between the sense resistor and each of the sense electrode and the emitter electrode, and reduces a loop formed by these connections. Since the current induced by the magnetic flux can be suppressed, a current can be detected with high precision. Further, since the semiconductor device does not include a control board but includes only a sense resistor that is included in a conventional control board, an increase in the package size can be prevented.

The object, features, aspects and advantages of the present invention will become more apparent from the following detailed description and the accompanying drawings.

DESCRIPTION OF EMBODIMENTS

Embodiment 1

Figure 1:
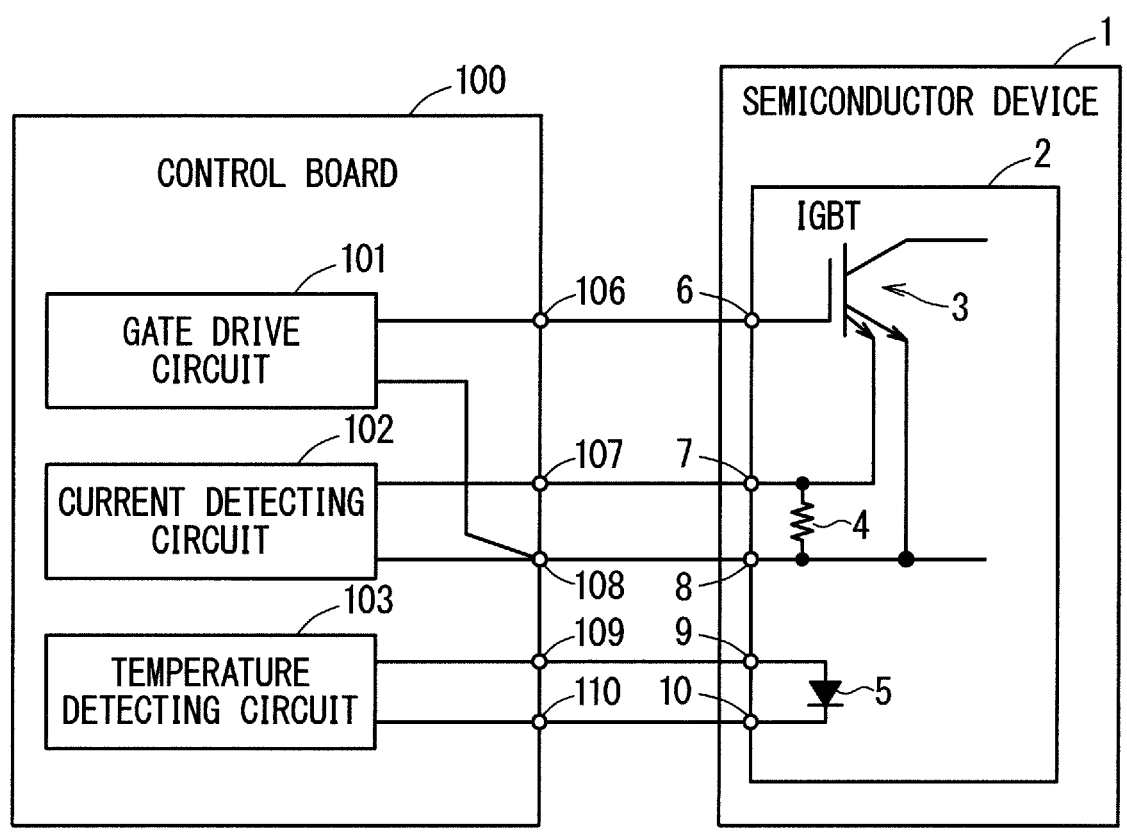
FIG. 1 schematically illustrates a structure of a semiconductor device and a control board connected to the semiconductor device according to Embodiment 1.
Figure 2:
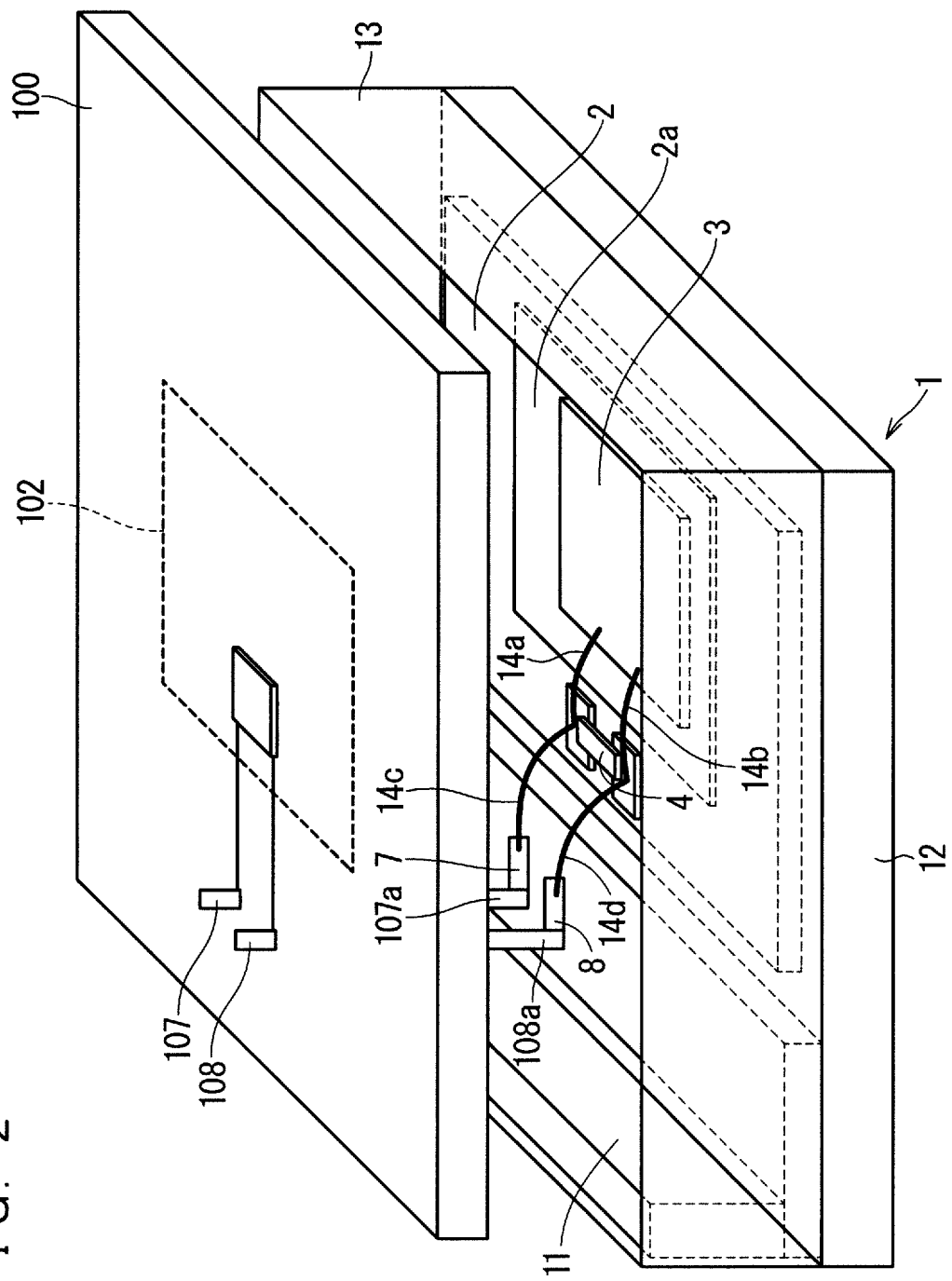
FIG. 2 is a perspective view of the semiconductor device and the control board connected to the semiconductor device according to Embodiment 1.
Figure 3:
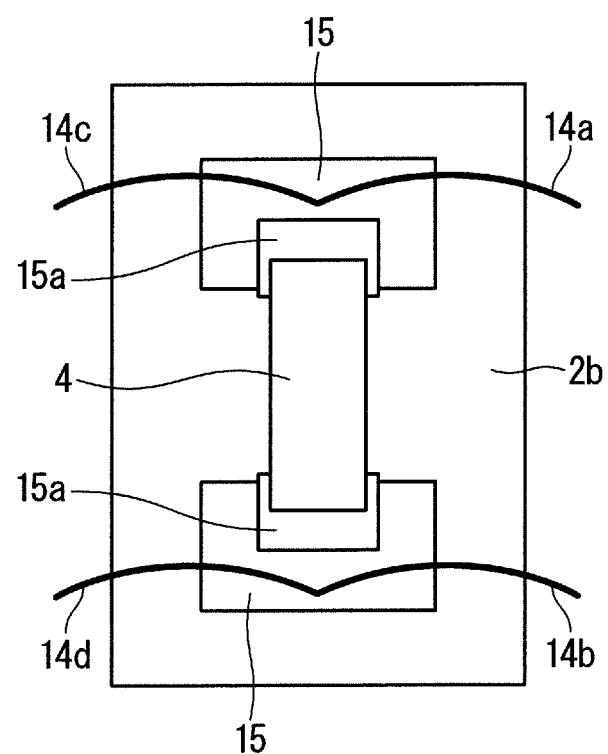
FIG. 3 is a plan view of a sense resistor included in the semiconductor device and the periphery of the sense resistor according to Embodiment 1.

Embodiment 1 of the present invention will be hereinafter described with reference to the drawings. FIG. 1 schematically illustrates a structure of a semiconductor device 1 and a control board 100 connected to the semiconductor device 1 according to Embodiment 1. FIG. 2 is a perspective view of the semiconductor device 1 and the control board 100. FIG. 3 is a plan view of a sense resistor 4 included in the semiconductor device 1 and the periphery of the sense resistor 4.

As illustrated in FIGS. 1 and 2, the semiconductor device 1 includes an insulating substrate 2, an IGBT 3 functioning as a semiconductor element, the sense resistor 4, a diode 5, a gate terminal 6, a sense terminal 7, an emitter terminal 8, an anode terminal 9, a cathode terminal 10, a fitted portion 11, a heat spreader 12, and a casing 13.

The IGBT 3 is disposed on an upper surface of the insulating substrate 2. Specifically, the IGBT 3 is disposed on an upper surface of an electrode pattern 2a on the upper surface of the insulating substrate 2. The IGBT 3 includes a gate electrode connected to the gate terminal 6, a sense electrode connected to the sense terminal 7, and an emitter electrode connected to the emitter terminal 8.

The diode 5 is disposed on the upper surface of the insulating substrate 2 or mounted on a chip of the IGBT 3 as an on-chip temperature sensor. The diode 5 includes an anode connected to the anode terminal 9, and a cathode connected to the cathode terminal 10.

As illustrated in FIGS. 2 and 3, the sense resistor 4 is disposed on an upper surface of an electrode pattern 2b on the upper surface of the insulating substrate 2, and has one end connected to the sense electrode of the IGBT 3 through a wire 14a and the other end connected to the emitter electrode of the IGBT 3 through a wire 14b. The location of the sense resistor 4 will be described later.

As illustrated in FIG. 2, the insulating substrate 2 is disposed on an upper surface of the heat spreader 12, and the L-shaped fitted portion 11 is disposed on the upper surface of the heat spreader 12 in front view. The casing 13 is disposed on the periphery of the upper surface of the heat spreader 12 to enclose the insulating substrate 2 and the fitted portion 11. The gate terminal 6, the sense terminal 7, the emitter terminal 8, the anode terminal 9, and the cathode terminal 10 are disposed in the fitted portion 11. FIG. 2 illustrates only the sense terminal 7 and the emitter terminal 8.

Further as illustrated in FIG. 1, the control board 100 is connected to the semiconductor device 1. The control board 100 has a function of detecting a current flowing through the IGBT 3 included in the semiconductor device 1. The control board 100 includes a gate drive circuit 101, a current detecting circuit 102, a temperature detecting circuit 103, and control terminals 106 to 110.

The gate drive circuit 101 is connected to the control terminals 106 and 108. The current detecting circuit 102 is connected to the control terminals 107 and 108. The temperature detecting circuit 103 is connected to the control terminals 109 and 110.

The control terminal 106 is connected to the gate terminal 6 of the semiconductor device 1. The control terminal 107 is connected to the sense terminal 7 of the semiconductor device 1. The control terminal 108 is connected to the emitter terminal 8 of the semiconductor device 1. Further, the control terminal 109 is connected to the anode terminal 9 of the semiconductor device 1, and the control terminal 110 is connected to the cathode terminal 10 of the semiconductor device 1. The semiconductor device 1 and the control board 100 are connected through conductors.

Next, the location of the sense resistor 4 will be described with reference to FIGS. 2 and 3. As illustrated in FIGS. 2 and 3, two junction spaces 15 are defined on the upper surface of the electrode pattern 2b. Both ends of the sense resistor 4 are joined to the two junction spaces 15 through solder 15a. The wires 14a and 14c are connected to one of the junction spaces 15, and the wires 14b and 14d are connected to the other junction space 15. The wire 14c and the wire 14d are connected to the sense terminal 7 and the emitter terminal 8, respectively. The sense terminal 7 and the emitter terminal 8 are connected to the control terminal 107 and the control terminal 108 of the control board 100 through a conductor 107a and a conductor 108a, respectively.

As described above, since the sense resistor 4 is disposed on the insulating substrate 2 on which the IGBT 3 is disposed in the semiconductor device 1 according to Embodiment 1, the sense resistor 4 can be disposed proximate to the IGBT 3. This shortens a distance between the sense resistor 4 and each of the sense electrode and the emitter electrode, and reduces a loop formed by the wires 14a and 14b. Since the current induced by the magnetic flux can be suppressed, a current can be detected with high precision. Further, since the semiconductor device 1 does not include the control board 100 but includes only the sense resistor 4 that is included in a conventional control board, an increase in the package size can be prevented.

Moreover, since the sense resistor 4 can be mounted with the same timing as that of the IGBT 3 and processes of solder coating and mounting of the sense resistor 4 can be integrated into a die-bonding process, reduction in the manufacturing cost of the semiconductor device 1 can be expected.

Embodiment 2

Figure 4:
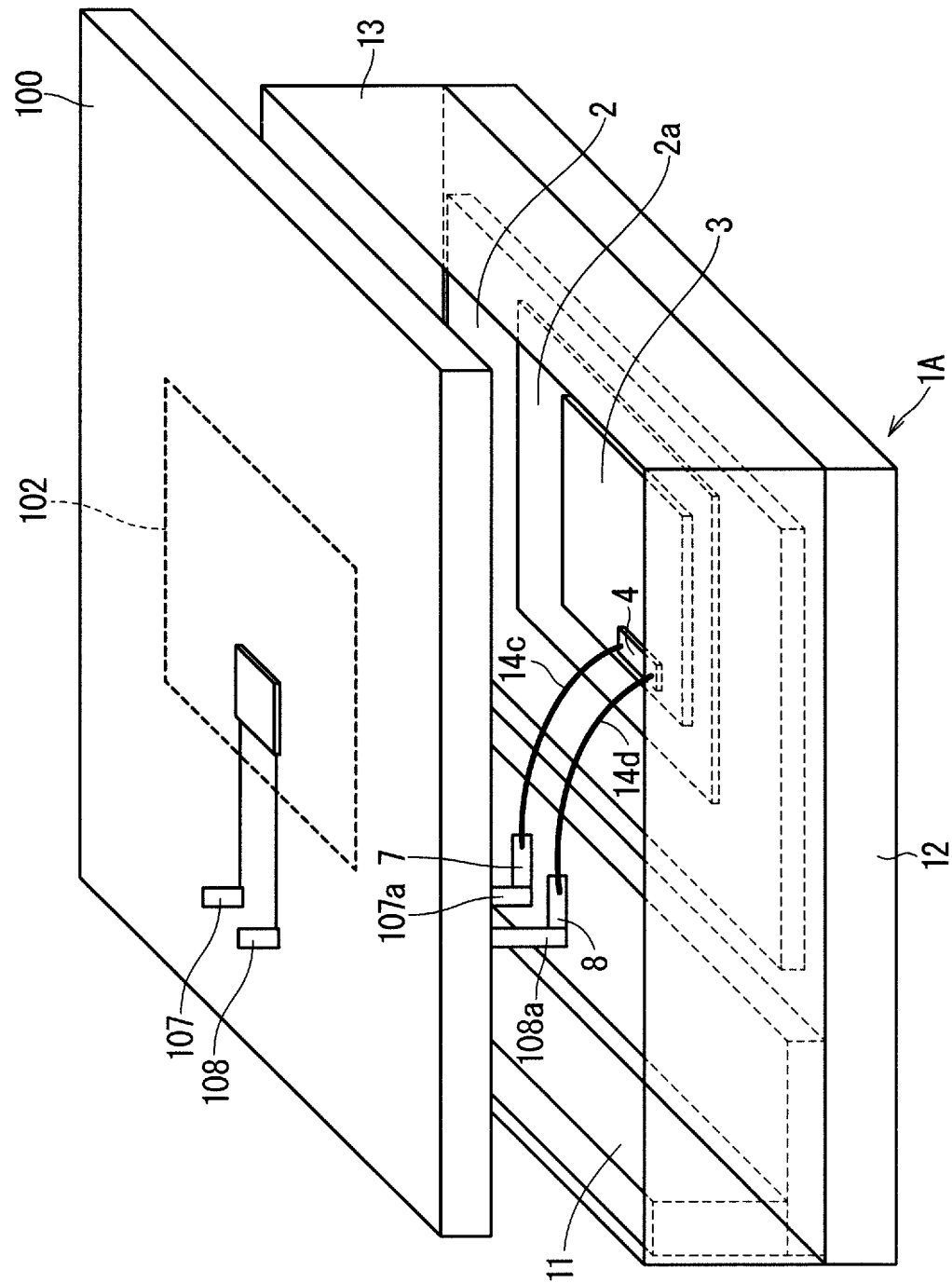
FIG. 4 is a perspective view of a semiconductor device and the control board connected to the semiconductor device according to Embodiment 2.
Figure 5:
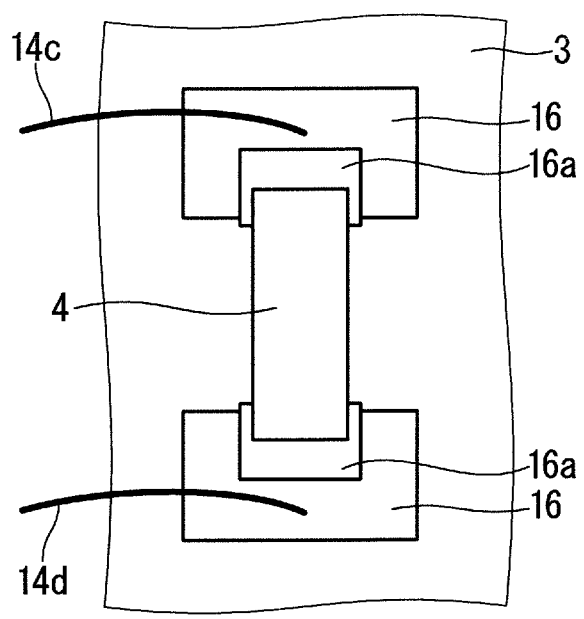
FIG. 5 is a plan view of the sense resistor included in the semiconductor device and the periphery of the sense resistor according to Embodiment 2.

Next, a semiconductor device 1A according to Embodiment 2 will be described. FIG. 4 is a perspective view of the semiconductor device 1A and the control board 100 connected to the semiconductor device 1A according to Embodiment 2. FIG. 5 is a plan view of the sense resistor 4 included in the semiconductor device 1A and the periphery of the sense resistor 4. In Embodiment 2, the same reference numerals will be assigned to the same constituent elements described in Embodiment 1, and the description thereof will be omitted.

As illustrated in FIGS. 4 and 5, the sense resistor 4 is directly connected not to the insulating substrate 2 but to an upper surface of the IGBT 3 according to Embodiment 2. Specifically, both ends of the sense resistor 4 are joined, through solder 16a, to two signal pads 16 disposed on the upper surface of the IGBT 3. The two signal pads 16 are the sense electrode and the emitter electrode.

As described above, since one end of the sense resistor 4 is directly connected to the sense electrode and the other end of the sense resistor 4 is directly connected to the emitter electrode in the semiconductor device 1A according to Embodiment 2, a loop formed by connecting the IGBT 3 and the sense resistor 4 can be minimized. Consequently, the induced current can be further suppressed.

Embodiment 3

Figure 6:
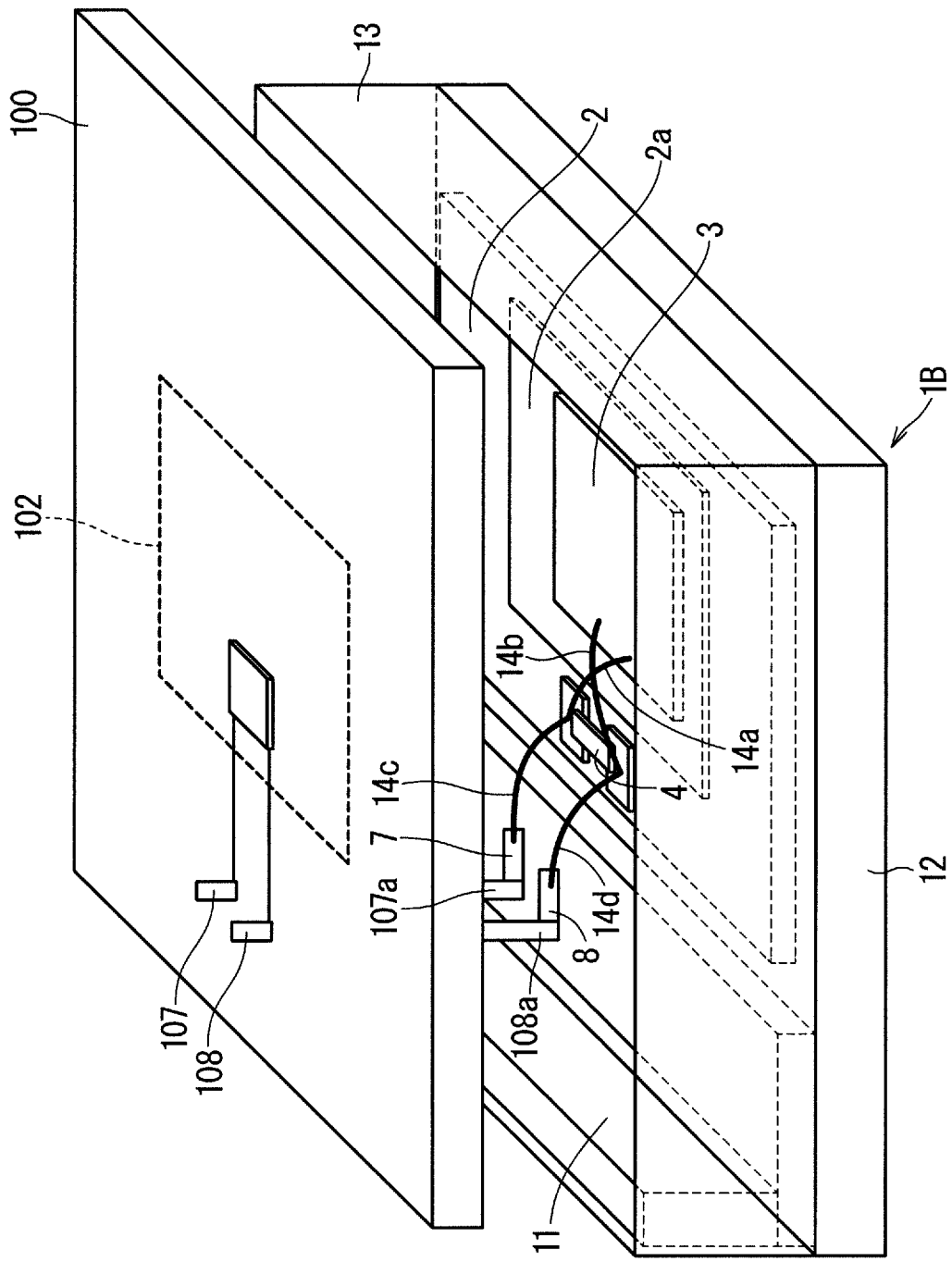
FIG. 6 is a perspective view of a semiconductor device and the control board connected to the semiconductor device according to Embodiment 3.
Figure 7:
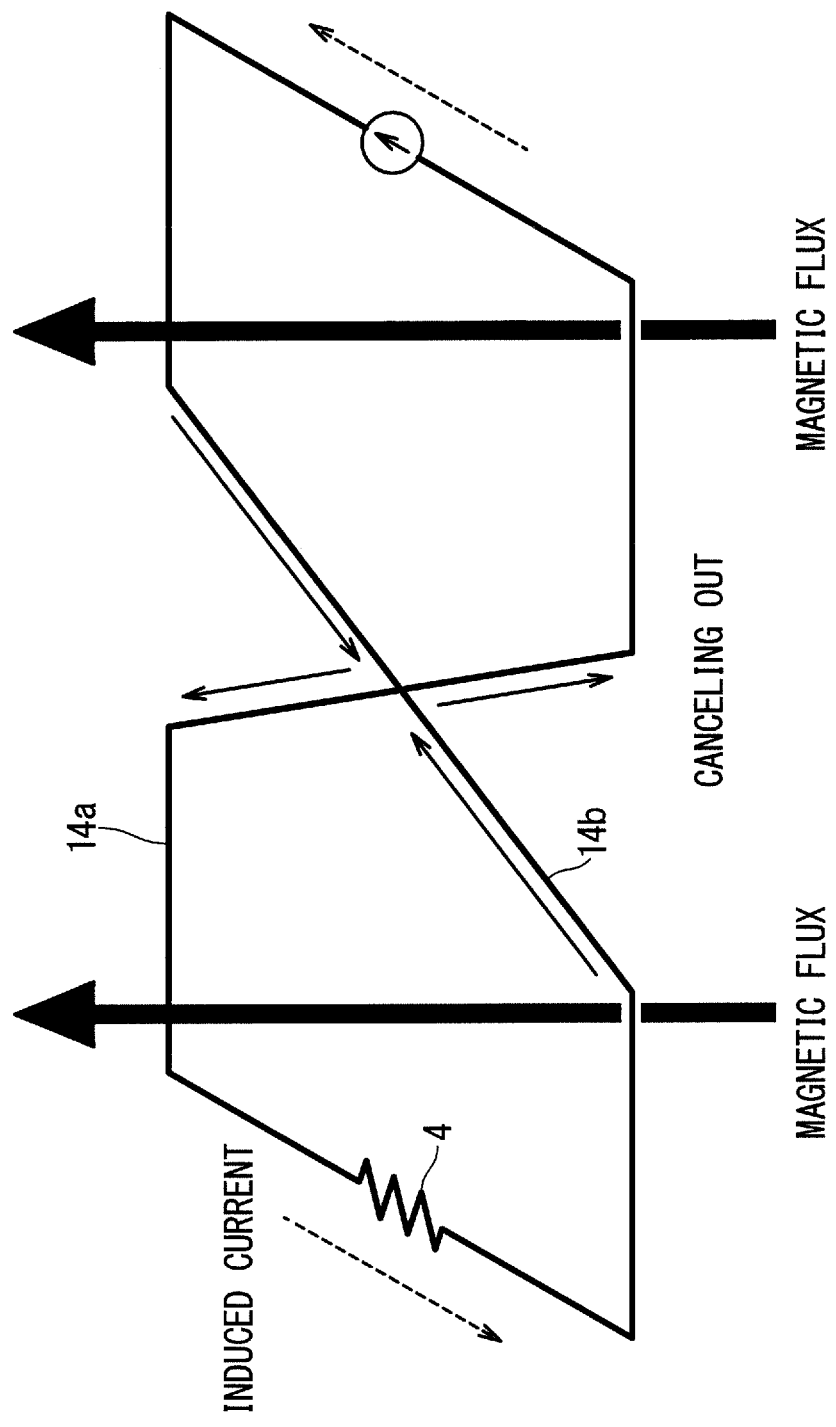
FIG. 7 is a drawing for describing induced currents canceling each other out.

Next, a semiconductor device according to Embodiment 3 will be described. FIG. 6 is a perspective view of a semiconductor device 1B and the control board 100 connected to the semiconductor device 1B according to Embodiment 3. FIG. 7 is a drawing for describing induced currents canceling each other out. In Embodiment 3, the same reference numerals will be assigned to the same constituent elements described in Embodiments 1 and 2, and the description thereof will be omitted.

As illustrated in FIG. 6, the wire 14a for connecting one end of the sense resistor 4 to the sense electrode and the wire 14b for connecting the other end of the sense resistor 4 to the emitter electrode cross each other. The wire 14a corresponds to a first wire, and the wire 14b corresponds to a second wire.

As illustrated in FIG. 7, the wire 14a and the wire 14b cross each other to form two loops. Thus, magnetic fluxes passing through these two loops generate induced currents in opposite directions, that is, in a direction of cancelling out each other. Consequently, the induced currents flowing between the IGBT 3 and the sense resistor 4 can be suppressed.

As described above, since the wire 14a and the wire 14b cross each other in the semiconductor device 1B according to Embodiment 3, the induced currents occur in a direction of cancelling out each other due to the magnetic fluxes passing through the two loops. Thus, the induced currents flowing between the IGBT 3 and the sense resistor 4 can be suppressed.

Moreover, since the sense resistor 4 is disposed proximate to the IGBT 3, the wire 14a and the wire 14b can be shortened. Consequently, since the two loops can be formed with the equal size with reduced variations in size, the significant effect of suppressing the induced currents can be obtained.

Embodiment 4

Figure 8:
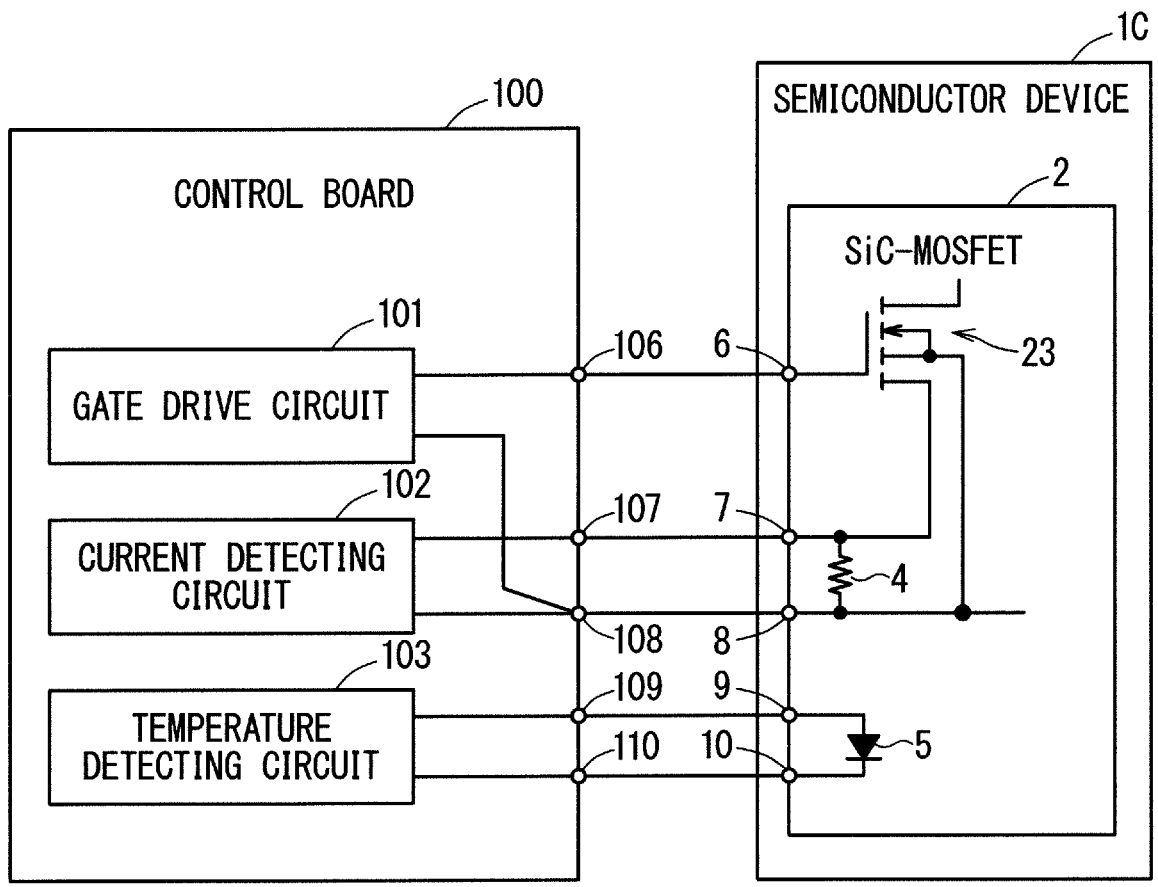
FIG. 8 schematically illustrates a structure of a semiconductor device and the control board connected to the semiconductor device according to Embodiment 4.

Next, a semiconductor device according to Embodiment 4 will be described. FIG. 8 schematically illustrates a structure of a semiconductor device 1C and the control board 100 connected to the semiconductor device 1C according to Embodiment 4. In Embodiment 4, the same reference numerals will be assigned to the same constituent elements described in Embodiments 1 to 3, and the description thereof will be omitted.

As illustrated in FIG. 8, the semiconductor element contains a wide bandgap material higher in bandgap than silicon according to Embodiment 4. In other words, a MOSFET 23 containing, for example, an SiC material is used as the semiconductor element.

The semiconductor element containing such a wide bandgap material exhibits higher voltage endurance, has a higher permissible current density, and is operated at a higher switching speed. Although noise accompanied by the switching is prone to increasing more than that in the IGBT 3, applying the structures according to Embodiments 1 to 3 to the semiconductor device 1C including the MOSFET 23 is particularly effective at improving the precision of detecting a current.

As described above, since the semiconductor element contains a wide bandgap material in the semiconductor device 1C according to Embodiment 4, a current can be detected with noise immunity.

Although this invention has been described in detail, the description is in all aspects illustrative and does not restrict the invention. It is therefore understood that numerous modifications and variations can be devised without departing from the scope of the invention.

Embodiments can be freely combined, and appropriately modified or omitted within the scope of the present invention.

EXPLANATION OF REFERENCE SIGNS

1, 1A, 1B, 1C semiconductor device, 2 insulating substrate, 3 IGBT, 4 sense resistor, 14a, 14b wire, 100 control board.

The invention claimed is:

1. A semiconductor device connectable to a control board that detects a current flowing through a semiconductor element included in the semiconductor device, the semiconductor device comprising:
   an insulating substrate;
   the semiconductor element disposed on the insulating substrate and including a sense electrode and an emitter electrode; and
   a sense resistor disposed on the insulating substrate without another substrate interposed therebetween and having one end connected to the sense electrode and the other end connected to the emitter electrode, wherein
   the control board detects a potential difference between both of the ends of the sense resistor to detect the current flowing through the semiconductor element.

2. A semiconductor device connectable to a control board that detects a current flowing through a semiconductor element included in the semiconductor device, the semiconductor device comprising:
   an insulating substrate;
   the semiconductor element disposed on the insulating substrate and including a sense electrode and an emitter electrode; and
   a sense resistor disposed on the insulating substrate and having one end connected to the sense electrode and the other end connected to the emitter electrode, wherein
   the control board detects a potential difference between both of the ends of the sense resistor to detect the current flowing through the semiconductor element,
   the one end of the sense resistor is directly connected to the sense electrode, and
   the other end of the sense resistor is directly connected to the emitter electrode.

3. The semiconductor device according to claim 1, wherein
   the one end of the sense resistor is connected to the sense electrode through a first wire,
   the other end of the sense resistor is connected to the emitter electrode through a second wire, and
   the first wire and the second wire cross each other.

4. The semiconductor device according to claim 1, wherein
   the semiconductor element contains a wide bandgap material.

* * * * *